United States Patent
Kim et al.

(10) Patent No.: US 10,184,178 B2
(45) Date of Patent: Jan. 22, 2019

(54) PLASMA-ENHANCED CHEMICAL VAPOR DEPOSITION (PE-CVD) APPARATUS AND METHOD OF OPERATING THE SAME

(71) Applicants: Minjong Kim, Hwaseong-si (KR);
Jung-soo Yoon, Hwaseong-si (KR);
Jang-Hee Lee, Yongin-si (KR);
Jongwon Hong, Hwaseong-si (KR)

(72) Inventors: Minjong Kim, Hwaseong-si (KR);
Jung-soo Yoon, Hwaseong-si (KR);
Jang-Hee Lee, Yongin-si (KR);
Jongwon Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 419 days.

(21) Appl. No.: 14/959,333

(22) Filed: Dec. 4, 2015

(65) Prior Publication Data
US 2016/0281225 A1    Sep. 29, 2016

(30) Foreign Application Priority Data
Mar. 27, 2015    (KR) .......................... 10-2015-0043086

(51) Int. Cl.
*C23C 16/455* (2006.01)
*C23C 16/50* (2006.01)
*C23C 16/505* (2006.01)
*H01J 37/32* (2006.01)

(52) U.S. Cl.
CPC .......... *C23C 16/455* (2013.01); *C23C 16/505* (2013.01); *H01J 37/32* (2013.01)

(58) Field of Classification Search
None
See application file for complete search history.

(56) References Cited

U.S. PATENT DOCUMENTS

| | | | |
|---|---|---|---|
| 5,965,034 A | 10/1999 | Vinogradov et al. | |
| 7,628,899 B2 | 12/2009 | White et al. | |
| 8,540,844 B2 | 9/2013 | Hudson et al. | |
| 2001/0055672 A1* | 12/2001 | Todd | C07F 7/0896 428/212 |
| 2010/0065216 A1 | 3/2010 | Tiller et al. | |
| 2010/0089319 A1 | 4/2010 | Sorensen et al. | |
| 2011/0284100 A1 | 11/2011 | Kudela et al. | |
| 2012/0161405 A1* | 6/2012 | Mohn | C23C 16/401 279/142 |

(Continued)

FOREIGN PATENT DOCUMENTS

| | | |
|---|---|---|
| JP | 4542198 B2 | 9/2010 |
| JP | 5701050 B2 | 4/2015 |
| KR | 10-0686285 B1 | 2/2007 |

*Primary Examiner* — Jethro M. Pence
(74) *Attorney, Agent, or Firm* — Harness, Dickey & Pierce, P.L.C.

(57) ABSTRACT

A deposition apparatus includes a chuck in a process chamber, the chuck having a top surface on which a substrate is loaded, a showerhead disposed over the chuck, and a fence extension disposed in the process chamber. Plasma is generated in a space between the showerhead and the loaded substrate during a deposition process. The fence extension at least partially confines the plasma in the space during the deposition process, thereby enabling improved thickness uniformity and reliability of a layer deposited on the loaded substrate during the deposition process.

12 Claims, 10 Drawing Sheets

(56) References Cited

U.S. PATENT DOCUMENTS

| | | | |
|---|---|---|---|
| 2013/0189840 A1* | 7/2013 | Fu | C23C 16/0236 |
| | | | 438/680 |
| 2013/0228124 A1 | 9/2013 | Furuta et al. | |
| 2013/0295297 A1 | 11/2013 | Chou et al. | |
| 2014/0235062 A1 | 8/2014 | Urakawa | |
| 2014/0326276 A1* | 11/2014 | Wu | C23C 16/4405 |
| | | | 134/1.1 |

* cited by examiner

PLASMA-ENHANCED CHEMICAL VAPOR DEPOSITION (PE-CVD) APPARATUS AND METHOD OF OPERATING THE SAME

CROSS-REFERENCE TO RELATED APPLICATION

This U.S. non-provisional patent application claims priority under 35 U.S.C. § 119 to Korean Patent Application No. 10-2015-0043086, filed on Mar. 27, 2015, in the Korean Intellectual Property Office, the disclosure of which is hereby incorporated by reference in its entirety.

BACKGROUND

The inventive concepts relate to a semiconductor manufacturing apparatus and a method of operating the same. More particularly, the inventive concepts relate to a plasma-enhanced chemical vapor deposition (PE-CVD) apparatus and a method of operating the same.

Semiconductor devices are widely used in an electronic industry because of their small sizes, multi-functional characteristics, and/or low manufacture costs. Semiconductor devices may be manufactured using various semiconductor manufacturing processes, such as deposition processes, ion implantation processes, photolithography processes, and etching processes. Some of these semiconductor manufacturing processes may utilize plasma, including plasma-enhanced chemical vapor deposition (PE-CVD processes.

As semiconductor devices have become more integrated, structures of the semiconductor devices have become more complex. In addition, sizes of wafers used to manufacture semiconductor devices have been increased to improve productivity of semiconductor devices. Thus, various problems of the semiconductor manufacturing processes may be caused.

In some cases, where a semiconductor manufacturing process utilizes plasma, including plasma-enhanced chemical vapor deposition (PE-CVD processes, the plasma concentration over a substrate during a deposition process may be uneven, which can result in reduced thickness uniformity of layers deposited on the substrate. Reduced layer thickness uniformity can result in layer reliability which is less than ideal.

SUMMARY

Some example embodiments of the inventive concepts may provide a plasma-enhanced chemical vapor deposition (PE-CVD) apparatus capable of improving reliability of a deposited layer and a method of operating the same.

Some example embodiments of the inventive concepts may also provide a PE-CVD apparatus capable of improving uniformity of a thickness of a deposited layer and a method of operating the same.

Some example embodiments of the inventive concepts may also provide a PE-CVD apparatus capable of improving a deposition rate of a layer and a method of operating the same.

In some embodiments, a PE-CVD apparatus may include a process chamber comprising a wall portion and a bottom plate that define an inner space in which a deposition process is performed, a chuck in the process chamber and movable at least one vertical direction, the chuck including a top surface configured to support a substrate loaded during the deposition process, a showerhead disposed over the chuck, an insulating body surrounding a sidewall of the showerhead, a fence extension extending downward from the insulating body and disposed in the process chamber, and a high-frequency power source, coupled to the showerhead, configured to generate plasma between the showerhead and the loaded substrate supported on the top surface of the chuck during the deposition process. The fence extension may be at least partially disposed between the wall portion and the plasma during the deposition process.

In some embodiments, a height of the fence extension from a bottom surface of the showerhead to a bottom surface of the fence extension may be greater than a distance between the bottom surface of the showerhead and a top surface of the loaded substrate during the deposition process.

In some embodiments, the height of the fence extension may be greater than a distance between the bottom surface of the showerhead and the top surface of the chuck during the deposition process.

In some embodiments, the fence extension may surround the plasma, a sidewall of the loaded substrate, and at least a portion of a sidewall of the chuck during the deposition process.

In some embodiments, the fence extension may be spaced apart from the wall portion, and the fence extension may be spaced apart from the chuck and the loaded substrate during the deposition process.

In some embodiments, the insulating body and the fence extension may constitute one body and may include the same insulating material.

In some embodiments, the insulating body and the fence extension may include ceramic.

In some embodiments, the high-frequency power source may be configured to generate the plasma based on generating the high-frequency power, and a frequency of the high-frequency power may be higher than 13.56 MHz and equal to or lower than 2.4 GHz.

In some embodiments, the PE-CVD apparatus may further include a low-frequency power source coupled to the showerhead and configured to generate a low-frequency power. A frequency of the low-frequency power may be lower than the frequency of the high-frequency power.

In some embodiments, a distance between a bottom surface of the showerhead and the top surface of the chuck may be in a range of 8 mm to 20 mm during the deposition process.

In some embodiments, the fence extension may include an inner sidewall configured to be located adjacent to the plasma during the deposition process, and an outer sidewall opposite to the inner sidewall. An inner width of the fence extension between opposite-facing portions of the inner sidewall may be greater than a width of the top surface of the chuck.

In some embodiments, a width of a bottom surface of the showerhead may be greater than a width of the top surface of the chuck.

In some embodiments, the fence extension may include an inner sidewall configured to be located adjacent to the plasma during the deposition process, and an outer sidewall opposite to the inner sidewall. The outer sidewall of the fence extension may include at least one inclined surface, and the at least one inclined surface may be inclined with respect to a direction perpendicular to the top surface of the chuck.

In some embodiments, the insulating body and the fence extension may each comprise closed-loop shapes.

In another aspect, a PE-CVD apparatus may include a process chamber comprising a wall portion and a bottom plate that define an inner space in which a deposition process is performed, a chuck in the process chamber and movable in at least one vertical direction, the chuck having a top surface configured to support a loaded substrate, a showerhead disposed over the chuck, an insulating body surrounding a sidewall of the showerhead, a fence extension extending downward from the insulating body and disposed in the process chamber, and a high-frequency power source coupled to the showerhead and configured to generate a high-frequency power used for generating plasma. The plasma may be generated between the showerhead and the loaded substrate during the deposition process, and the fence extension may be configured to surround the plasma and at least a portion of a sidewall of the loaded substrate during the deposition process.

In some embodiments, the fence extension may surround the plasma, the sidewall of the loaded substrate, and at least a portion of a sidewall of the chuck during the deposition process, and the fence extension may be configured to be spaced apart from the wall portion, the loaded substrate, and the chuck during the deposition process.

In some embodiments, the insulating body and the fence extension may constitute one body and may include the same insulating material.

In still another aspect, a method of operating a PE-CVD apparatus may include loading a substrate on a top surface of a chuck in a process chamber included in the PE-CVD apparatus, the PE-CVD apparatus further including a showerhead disposed over the chuck, and a fence extension extending downward from a bottom surface of the showerhead, such that the fence extension at least partially surrounds a space between the substrate and the showerhead, and generating a plasma in the space. The fence extension may at least partially confine the plasma in the space during the deposition process.

In some embodiments, the fence extension may include an inner sidewall which is configured to b located adjacent to the plasma, and an outer sidewall opposite to the inner sidewall. An inner width of the fence extension between opposite-facing portions, facing each other, of the inner sidewall may be greater than a width of a top surface of the chuck.

In some embodiments, the fence extension may surround the plasma and at least a portion of a sidewall of the loaded substrate during the deposition process. The fence extension may be spaced apart from the wall portion of the process chamber, and the fence extension may be spaced apart from the loaded substrate and the chuck during the deposition process.

In some embodiments, the method includes, prior to generating the plasma in the space, raising the chuck to reduce a distance between a bottom surface of the showerhead and a top surface of the loaded substrate, such that the fence extension surrounds the space and at least a portion of a sidewall of the loaded substrate.

In some embodiments, the method includes raising the chuck to reduce a distance between a bottom surface of the showerhead and a top surface of the loaded substrate, such that the fence extension surrounds the space, the sidewall of the loaded substrate, and at least a portion of a sidewall of the chuck.

In some embodiments, a plasma-enhanced chemical vapor deposition (PE-CVD) apparatus may include a chuck, the chuck including a top surface configured to support a loaded substrate; a showerhead disposed over the chuck; and a fence extension at least partially surrounding a space between the showerhead and the top surface of the chuck.

The fence extension may be configured to at least partially confine a plasma generated in the space.

In some embodiments, to at least partially confine the plasma generated in the space, the fence extension may be configured to surround the plasma and at least a portion of a sidewall of the loaded substrate. In some embodiments, to at least partially confine the plasma generated in the space, the fence extension may be further configured to surround at least a portion of a sidewall of the chuck.

In some embodiments, the fence extension includes an inner sidewall configured to face towards the space, and an outer sidewall. The outer sidewall may include at least one inclined surface, and the at least one inclined surface may be inclined relative to the top surface of the chuck.

In some embodiments, the fence extension may be spaced apart from the chuck.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
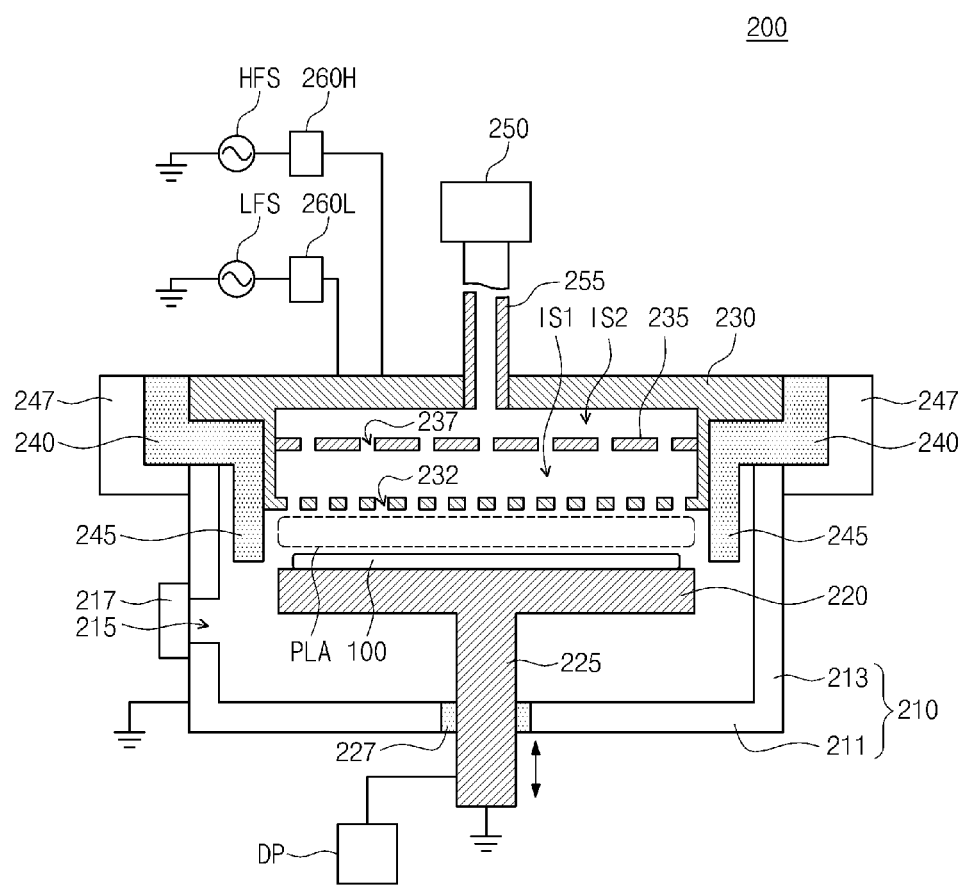
FIG. 1 is a cross-sectional view schematically illustrating a plasma-enhanced chemical vapor deposition (PE-CVD) apparatus according to some embodiments of the inventive concepts.

The inventive concepts will now be described more fully hereinafter with reference to the accompanying drawings, in which some example embodiments of the inventive concepts are shown. The advantages and features of the inventive concepts and methods of achieving them will be apparent from some example embodiments that will be described in more detail with reference to the accompanying drawings. It should be noted, however, that the inventive concepts are not limited to the example embodiments, and may be implemented in various forms. Accordingly, the example embodiments are provided only to disclose the inventive concepts and let those skilled in the art understand the inventive concepts. In the drawings, embodiments of the inventive concepts are not limited to the specific examples provided herein and may be exaggerated for clarity.

The terminology used herein is for the purpose of describing some example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as example views of the inventive concepts. Accordingly, shapes of the example views may be modified according to manufacturing techniques and/or allowable errors. Therefore, some embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Some embodiments of aspects of the present inventive concepts explained and illustrated herein may include their complementary counterparts. The same reference numerals or the same reference designators denote the same elements throughout the specification.

Moreover, some example embodiments are described herein with reference to cross-sectional illustrations and/or plane illustrations that are example illustrations. Accordingly, variations from the shapes of the illustrations as a result, for example, of manufacturing techniques and/or tolerances, are to be expected. Thus, example embodiments described herein with reference to example illustrations should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
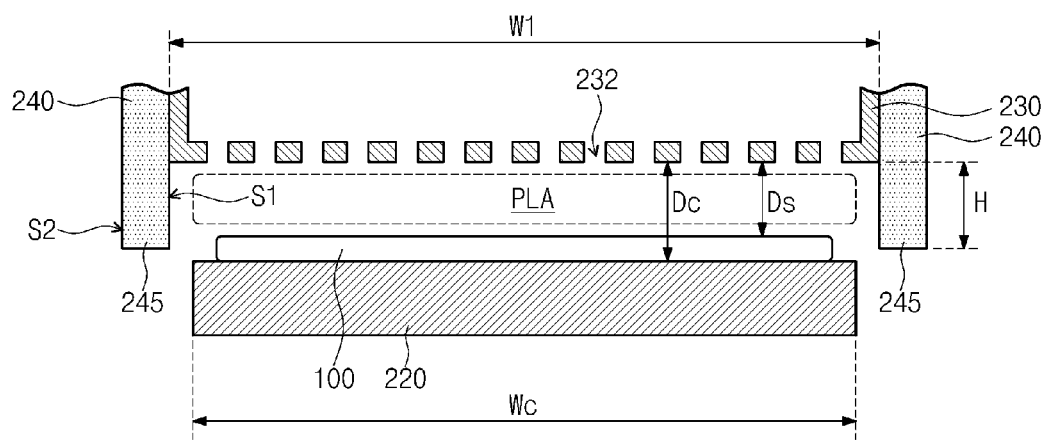
FIG. 2 is an enlarged view illustrating a showerhead, a chuck, an insulating body, and a fence extension of FIG. 1.
Figure 3:
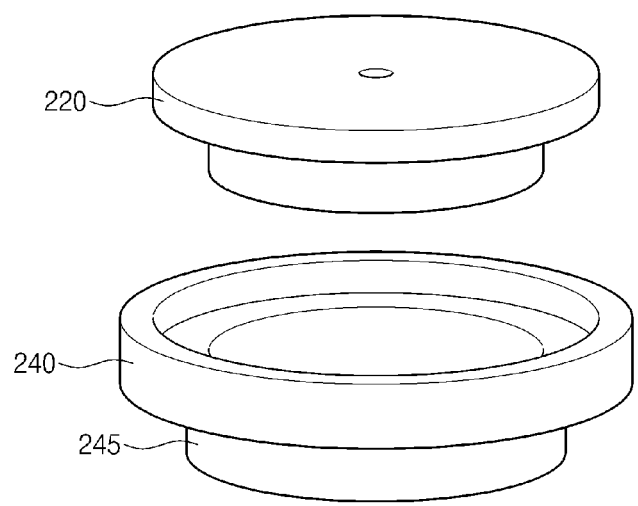
FIG. 3 is an exploded perspective view illustrating the showerhead, the insulating body, and the fence extension of FIG. 1.

FIG. 1 is a cross-sectional view schematically illustrating a plasma-enhanced chemical vapor deposition (PE-CVD) apparatus according to some embodiments of the inventive concepts. FIG. 2 is an enlarged view illustrating a showerhead, a chuck, an insulating body, and a fence extension of FIG. 1. FIG. 3 is an exploded perspective view illustrating the showerhead, the insulating body, and the fence extension of FIG. 1.

Referring to FIG. 1, a plasma-enhanced chemical vapor deposition (PE-CVD) apparatus 200 according to some embodiments includes a process chamber 210 having an inner space in which a deposition process is performed. The process chamber 210 includes a bottom plate 211 and a wall portion 213 which define the inner space. The wall portion 213 extends upward from an edge of the bottom plate 211. The bottom plate 211 and the wall portion 213 may be formed of a conductive material, for example, a metal (e.g., aluminum).

A substrate path 215 may penetrate a portion of the wall portion 213 of the process chamber 210, and a door unit 217 may close or open the substrate path 215. A substrate 100 on which the deposition process will be performed may be loaded into or unloaded from the process chamber 210 through the substrate path 215.

A chuck 220 is at least partially disposed in the process chamber 210. The chuck 220 may include a top surface on which the substrate 100 is loaded, such that the chuck 220 is configured to support a loaded substrate 100 on the top surface of the chuck. The substrate 100 may be, for example, a semiconductor wafer. The chuck 220 is disposed on a supporter 225 that penetrates the bottom plate 211 and is movable in up and down directions. In more detail, the supporter 225 may be movable in the vertical (up and down) directions by a driving device DP. The chuck 220 may be fixed on the supporter 225. Thus, the chuck 220 may be movable in the up and down directions by the supporter 225 and the driving device DP.

The chuck 220 and the supporter may include a conductive material (e.g., a metal such as aluminum). An insulator 227 may be disposed between the supporter 225 and the bottom plate 211, and the insulator 227 may be configured to insulate the supporter 225 from the bottom plate 211. In some embodiments, the chuck 220 is configured to control a temperature of the loaded substrate 100. In more detail, the chuck 220 may include a heating unit (not shown) configured to increase the temperature of the loaded substrate 100, and a cooling unit (not shown) configured to reduce the temperature of the loaded substrate 100. In addition, the chuck 220 may include lift pins that are used to load the substrate 100 safely on the top surface of the chuck 220. In some embodiments, the chuck 220 may be an electrostatic chuck fixing the loaded substrate 100 by means of electrostatic force or a vacuum chuck fixing the loaded substrate 100 by means of a vacuum pressure.

A showerhead 230 is disposed over the chuck 220. The showerhead 230 may be formed of a conductive material (e.g., a metal such as aluminum). The showerhead 230 may have an inner space into which a process gas is supplied. In some embodiments, a blocker plate 235 is disposed in the inner space of the showerhead 230 to divide the inner space into a first inner space IS1 and a second inner space IS2. The first inner space IS1 is defined under the blocker plate 235, and the second inner space IS2 is defined on the blocker plate 235. First holes 232 may penetrate a bottom plate of the showerhead 230 which forms a bottom surface of the first inner space IS1, and second holes 237 may penetrate the blocker plate 235. In some embodiments, the number of the first holes 232 per unit area is different from the number of the second holes 237 per unit area. For example, the number of the first holes 232 per unit area may be more than the number of the second holes 237 per unit area. The process gas supplied in the second inner space IS2 may be uniformly supplied into the first inner space IS1 through the second holes 237, and the process as supplied in the first inner space IS1 may be uniformly provided over the loaded substrate 100 through the first holes 232.

One end portion of the gas supply pipe 255 penetrates a top plate of the showerhead 230 which forms a top surface of the second inner space IS2. The gas supply pipe 255 is connected to the second inner space of the showerhead 230. A gas supply unit 250 may be connected to another end portion of the gas supply pipe 255. The gas supply unit 250 may provide the process gas into the second inner space IS2 of the showerhead 230. The process gas may include one or more source gasses.

As shown in FIG. 1, the showerhead 230 and the top surface of the chuck 220 establish a space which is vertically bounded, on top and bottom ends, by at least a portion of the showerhead 230 and the top surface of the chuck 220, respectively. The space may be bounded, on a bottom end, by a top surface of a substrate loaded on the top surface of the chuck 220. Process gas may be supplied into the space from showerhead 230 via holes 232 of the showerhead 230.

An insulating body 240 at least partial y surrounds a sidewall of the showerhead 230. The insulating body 240 may be in contact with the sidewall of the showerhead 230 and may be coupled to the showerhead 230. In some embodiments, the insulating body 240 is fixed on the showerhead 230 by a fixing part 247. The insulating body 240 and the showerhead 230 which are coupled to each other may close a top end of the inner space of the process chamber 210. The insulating body 240 may insulate the showerhead 230 from the process chamber 210. An upper portion of the sidewall of the showerhead 230 may laterally protrude, and the insulating body 240 may surround a sidewall and a bottom surface of the protruding portion of the showerhead 230.

A fence extension 245 extends downward from a bottom surface of the insulating body 240. The fence extension 245 protrudes, extends, etc. downward from a bottom surface of the showerhead 230, which can include protruding, extending, etc. toward a bottom surface of the process chamber 210, such that a bottom surface of the fence extension 245 is disposed at a lower level than the bottom surface of the showerhead 230. The fence extension 245 may not vertically overlap with the bottom surface of the showerhead 230. The fence extension 245 is disposed in the process chamber 210 (i.e., is located within the inner space of the process chamber 210) and is laterally spaced apart from an inner sidewall of the wall portion 213 of the process chamber 210. As illustrated in FIG. 2, the fence extension 245 includes a height H from the bottom surface of the showerhead 230 to the bottom surface of the fence extension 245. The height H of the fence extension 245 will be described in more detail later. The fence extension 245 may be formed of an insulating material.

The insulating body 240 and the fence extension 245 may constitute one body, also referred to herein as being comprised in an individual body, such that an interface between the insulating body 240 and the fence extension 245 is absent. Thus, the insulating body 240 and the fence extension 245 may include the same insulating material. For example, the insulating body 240 and the fence extension 245 may be formed of ceramic (e.g., aluminum oxide or aluminum nitride).

The fence extension 245 may at least horizontally bound the space which is located between the showerhead 230 and the top surface of the chuck 220, such that the fence extension 245 at least partially surrounds the space. Where a substrate 100 is loaded on a top surface of the chuck 220, the fence extension 245 may at least partially surround a sidewall of one or more of the substrate 100 or the chuck 200. The fence extension 245 may at least partially confine process gasses introduced into the space from the showerhead 230, based at least in part upon the fence extension 245 at least partially surrounding the space.

A high-frequency power source HFS generating a high-frequency power may be coupled to the showerhead 230. The high-frequency power may be a plasma power source configured to gene capacitively coupled plasma (CCP), and plasma PLA may be generated, in the space which is at least partially bounded vertically between the showerhead 230 and the loaded substrate 100, by the high-frequency power during the deposition process. For example, the process gas may be supplied into the space, and over the loaded substrate 100, via the first holes 232 of the showerhead 230, and the high-frequency power may convert the process gas into the plasma PLA. The chuck 220 and the showerhead 230 may be respectively used as a bottom electrode and a top electrode during the deposition process, and thus, the capacitively coupled plasma PLA may be generated in the space which is at least partially bounded vertically between the showerhead 230 and the loaded substrate 100 and may be at least partially bounded horizontally (surrounded) by the fence extension 245. Concurrently with the generation of the capacitively coupled plasma PLA where the chuck 220 and the showerhead 230 are respectively used as a bottom electrode and a top electrode during the deposition process, a ground voltage may be applied to the wall portion 213 and the bottom plate 211 of the process chamber 210. In some embodiments, the ground voltage may also be applied to the chuck 220 during the deposition process. However, the inventive concepts are not limited thereto. In some embodiments, a back bias may be applied to the chuck 220 during the deposition process. A frequency of the back bias may be equal to or lower than that of the high-frequency power.

A high-frequency matching box 260H may be connected between the high-frequency power source HFS and the showerhead 230, such that the high-frequency power of the high-frequency power source HFS is applied to the showerhead 230 through the high-frequency matching box 260H. The high-frequency matching box 260H may improve transmission efficiency of the high-frequency power, relative to some embodiments where the high-frequency matching box 260H is absent.

The frequency of the high-frequency power generated from the high-frequency power source (HFS) may be higher than 13.56 MHz. In more detail, the frequency of the high-frequency power may be higher than 13.56 MHz and equal to or lower than 2.4 GHz. In particular, the frequency of the high-frequency power may be in a range of 27.12 MHz to 2.4 GHz. Since the frequency of the high-frequency power is higher than 13.56 MHz, power of the high-frequency power may be increased to improve a deposition rate of a deposition layer.

A low-frequency power source (LFS) generating a low-frequency power may be coupled to the showerhead 230. Mobility of ions of the plasma PLA may be adjusted by the low-frequency power. Thus, characteristics of the deposition process may be more accurately adjusted, relative to some embodiments where the mobility of ions of the plasma PLA is adjusted by the low-frequency power. A frequency of the low-frequency power is lower than that of the high-frequency power. In some embodiments, the frequency of the low-frequency power may be lower than 5 MHz. For example, the frequency of the low-frequency power may be in a range of 200 KHz to 3 MHz.

A low-frequency matching box 260L may be connected between the low-frequency power source LFS and the showerhead 230, such that the low-frequency power of the low-frequency power source LFS is applied to the showerhead 230 through the low-frequency matching box 260L. The low-frequency matching box 260L may improve transmission efficiency of the low-frequency power, relative to some embodiments here the low-frequency matching box 260H is absent.

Hereinafter, the fence extension 245 will be described in more detail with reference to FIG. 2. Referring to FIGS. 1 and 2, where the fence extension 245 at least partially surrounds the space in which the plasma PLA may be generated during a deposition process, the fence extension 245 may be disposed between the plasma PLA and the wall portion 213 of the process chamber 220 during the deposition process. At this time, the fence extension 245 is spaced apart from the wall portion 213, the chuck 220, and the loaded substrate 100.

In more detail, the height H of the fence extension 245 is greater than a distance (e.g., a vertical distance) Ds between the bottom surface of the showerhead 230 and a top surface of the loaded substrate 100 during the deposition process. Thus, the fence extension 245 at least partially horizontally bounds the space which is at least partially vertically bounded between the chuck 220 and the showerhead 230 and therefore at least partially surrounds the plasma PLA during the deposition process, such that the fence extension 245 is disposed between the plasma PLA and the wall portion 213 of the process chamber 210 The fence extension 245 may at least partially confine the plasma PLA in the space. In addition, since the height H of the fence extension 245 may be greater than the distance Ds, the fence extension 245 may surround at least a portion of a sidewall of the loaded substrate 100 during the deposition process, such that the fence extension 245 may overlap with at least a portion of the sidewall of the loaded substrate 100 in a horizontal direction parallel to a top surface of the chuck 220.

The fence extension 245 includes an inner sidewall adjacent to the plasma PLA, and an outer sidewall S2 opposite to the inner sidewall S1. The fence extension 245 may have an inner width W1 between portions, facing each other, of the inner sidewall S1, and such portions may be referred to herein as opposite-facing portions. The inner width W1 of the fence extension 245 may be greater than a width Wc of the top surface of the chuck 220. In some embodiments, the inner width W1 of the fence extension 245 is equal to a width of the bottom surface of the showerhead 230, as illustrated in FIG. 2. Thus, the width of the bottom surface of the showerhead 230 may also be greater than the width Wc of the top surface of the chuck 220. The inner width W1 of the fence extension 245 may also be greater than a width of the loaded substrate 100. The width of the loaded substrate 100 may be smaller than the width Wc of the top surface of the chuck 220.

The outer sidewall S2 of the fence extension 245 may be spaced apart from the wall portion 213 of the process chamber 210. During the deposition process, the fence extension 245 may be spaced apart from the loaded substrate 100 and the chuck 220. In some embodiments, the inner sidewall S1 and the outer sidewall S2 of the fence extension 245 may be perpendicular to the top surface of the chuck 220, as illustrated in FIGS. 1 and 2.

In some embodiments, each of the insulating body 240 and the fence extension 245 may each comprise a closed-loop shape (e.g., a ring shape), as illustrated in FIG. 3. In this case, the inner width W1 of the fence extension 245 may correspond to an inner diameter of the fence extension 245. In addition, the bottom surface of the showerhead 230 may have a circular shape, and the top surface of the chuck 220 may also have a circular shape.

In some embodiments, the height H of the fence extension 245 may be smaller than a distance Dc between the bottom surface of the showerhead 230 and the top surface of the chuck 220 during the deposition process. However, the inventive concepts are not limited thereto.

The distance Dc between the bottom surface of the showerhead 230 and the top surface of the chuck 220 during the deposition process may range from 8 mm to 20 mm. In particular, the distance Dc during the deposit on process may range from 10 mm to 18 mm.

As described above, during the deposition process, the ground voltage may be applied to the wall portion 213 and the bottom plate 211 of the process chamber 210, and the high-frequency power having the frequency higher than 13.56 MHz may be applied to the showerhead 230. If the fence extension 245 does not exist, a density of the plasma PLA over an edge portion of the loaded substrate 100 adjacent to the wall portion 213 may be lower than that of the plasma PLA over a central portion of the loaded substrate 100 due to the ground voltage applied to the wall portion 213. Thus, a difference may occur between a thickness of a layer deposited on the edge portion of the loaded substrate 100 and a thickness of a layer deposited on the central portion of the loaded substrate 100, such that thickness uniformity of the deposited layer may be deteriorated.

However, according to some embodiments of the inventive concepts, the fence extension 245 may be disposed between the plasma PLA and the wall portion 213 of the process chamber 210 and may at least partially confine the plasma PLA in the space which is at least partially bound vertically between the showerhead 230 and the top surface of the chuck 220. Thus, it is possible to reduce or minimize a difference between the density of the plasma PLA over the edge portion of the loaded substrate 100 and the density of the plasma PLA over the central portion of the loaded substrate 100, such that the thickness uniformity of the deposited layer may be improved, such that reliability of the deposited layer may be improved. In addition, even though the deposition rate of the deposited layer is increased by increasing the frequency of the high-frequency power, the thickness uniformity of the deposited layer may be proved by the fence extension 245. Since the deposition rate of the deposited layer is increased, the productivity of a semiconductor device may be improved. In other words, the productivity and reliability of the semiconductor device may be improved by increasing the deposition rate of the deposited layer having the improved thickness uniformity and reliability.

The layer deposited on the loaded substrate 100 may include at least one of various layers, types of layers, etc. that can be formed by a PE-CVD process. For example, the deposited layer may include at least one of various layer types, including at least one of a silicon oxide layer (e.g., a tetraethyl orthosilicate (TEOS) layer), a silicon nitride layer, a silicon oxynitride layer, a silicon layer, a germanium layer, a silicon-germanium layer, a silicon carbide (SiC) layer, a silicon oxycarbide (SiOC) layer, a metal layer (e.g., a tungsten layer, an aluminum layer, a copper layer, a titanium layer, or a tantalum layer metal nitride layer (e.g., a tungsten nitride layer, a titanium nitride layer, or a tantalum nitride layer), or a metal oxide layer (e.g., an aluminum oxide layer, a hafnium oxide layer, an iridium oxide layer, or a titanium oxide layer). The process gas supplied through the showerhead 230 may be determined depending on a layer type of the deposited layer. As described above, the process gas may include one or more source gases.

Hereinafter, PE-CVD apparatuses according to other embodiments of the inventive concepts will be described. In the following embodiments, the same elements as described in the embodiment of FIGS. 1 through 3 will be indicated by the same reference numerals or the same reference designators. For the purpose of ease and convenience in explanation, the descriptions to the same elements as in the above embodiment may be omitted or mentioned briefly. In other words, differences between the embodiment of FIGS. 1 through 3 and the following embodiments will be mainly described.

Figure 4:
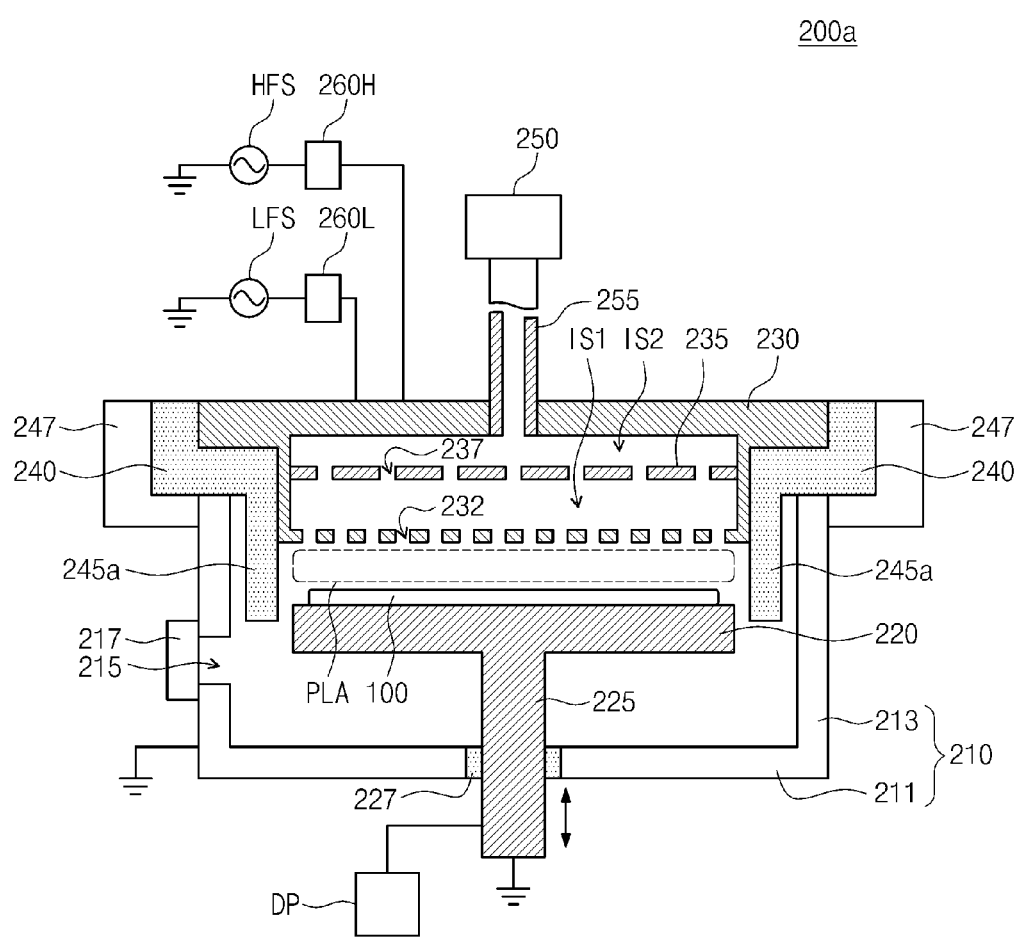
FIG. 4 is a cross-sectional view schematically illustrating a PE-CVD apparatus according to some embodiments of the inventive concepts.
Figure 5:
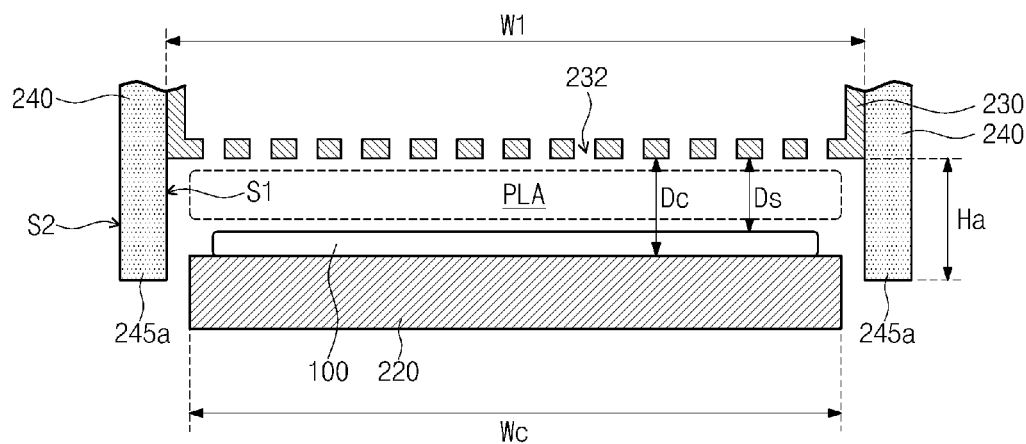
FIG. 5 is an enlarged view illustrating a showerhead, a chuck, an insulating body, and a fence extension of FIG. 4.

FIG. 4 is a cross-sectional view schematically illustrating a PE-CVD apparatus according to some embodiments of the inventive concepts. FIG. 5 is an enlarged view illustrating a showerhead, a chuck, an insulating body, and a fence extension of FIG. 4.

Referring to FIGS. 4 and 5, a PE-CVD apparatus 200a according to some embodiments may include a fence extension 245a extending downward from the bottom surface of the insulating body 240. The fence extension 245a includes a height Ha from the bottom surface of the showerhead 230 to a bottom surface of the fence extension 245a. In some embodiments, the height Ha of the fence extension 245a may be greater than the distance Dc between the top surface of the chuck 200 and the bottom surface of the showerhead 230 during the deposition process, such that the bottom surface of the fence extension 245a may be disposed at a lower level than the top surface of the chuck 220 during the deposition process. Thus, during the deposition process, the fence extension 245a may surround the plasma PLA, an entire sidewall of the loaded substrate 100, and at least a portion of a sidewall of the chuck 220. In some embodiments, the fence extension 245a may cover an entire sidewall of the chuck 220.

Since an inner width W1 of the fence extension 245a is greater than the width Wc of the top surface of the chuck 220, the fence extension 245a may be spaced apart from the chuck 220 during the deposition process. In addition, the fence extension 245a may also be spaced apart from the wall portion 213 of the process chamber 210 and the loaded substrate 100.

In some embodiments, the bottom surface of the fence extension 245a may be disposed at the same level as, or a higher level than, a top end of the substrate path 215. Thus, the fence extension 245a does not affect loading/unloading of the substrate 100.

According some embodiments, the fence extension 245a may surround the at least a portion of the sidewall of the chuck 220 as well as the entire sidewall of the loaded substrate 100, and thus, the effect of confining the plasma PLA may be more improved by the fence extension 245a.

Other elements and other features of the PE-CVD apparatus 200a according to the some embodiments may be the same as corresponding elements and corresponding features of the PE-CVD apparatus 200 according to some embodiments, including example embodiments illustrated in FIGS. 1 and 2.

Figure 6:
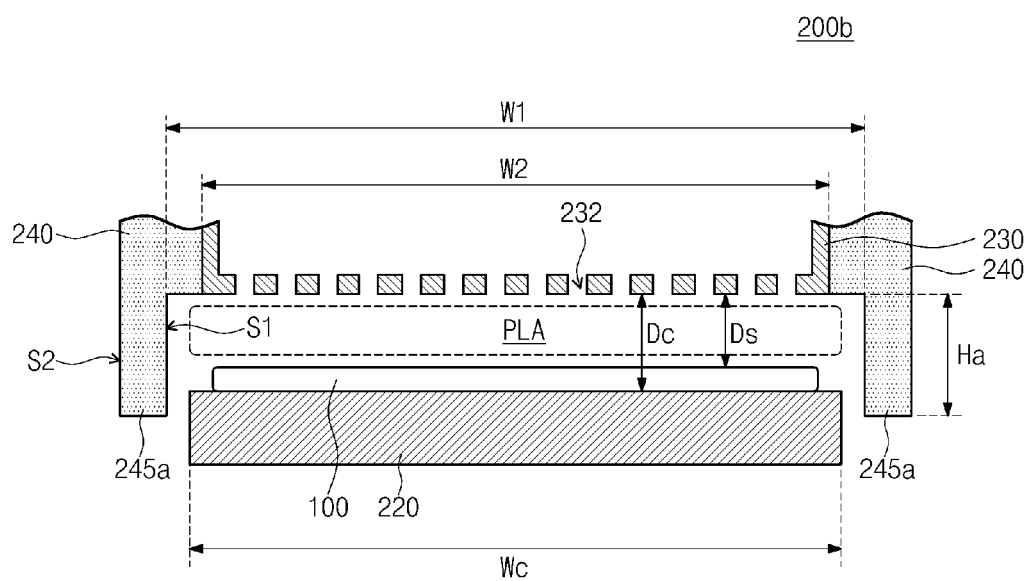
FIG. 6 is an enlarged view illustrating a showerhead, a chuck, an insulating body, and a fence extension of a PE-CVD apparatus according to some embodiments of the inventive concepts.

FIG. 6 is an enlarged view illustrating a showerhead, a chuck, an insulating body, and a fence extension of a PE-CVD apparatus according to some embodiments of the inventive concepts.

Referring to FIG. 6, in a PE-CVD apparatus 200b according to some embodiments, a width W2 of a bottom surface of the showerhead 230 may be smaller than the inner width W1 of the fence extension 245a. In this case, an inner sidewall S1 of the fence extension 245a may be laterally offset from a vertical contact surface of the showerhead 230 and the insulating body 240, which is adjacent to the inner sidewall S1. In some embodiments, the width W2 of the bottom surface of the showerhead 230 may be smaller than the width Wc of the top surface of the chuck 220. However, the width W2 of the bottom surface of the showerhead 230 may be greater than the width of the loaded substrate 100.

Other elements and other features of the PE-CVD apparatus 200b according to some embodiments may be the same as corresponding elements and corresponding features of the PE-CVD apparatus 200 according to some embodiments, including example embodiments illustrated in FIGS. 1 and 2.

Figure 7:
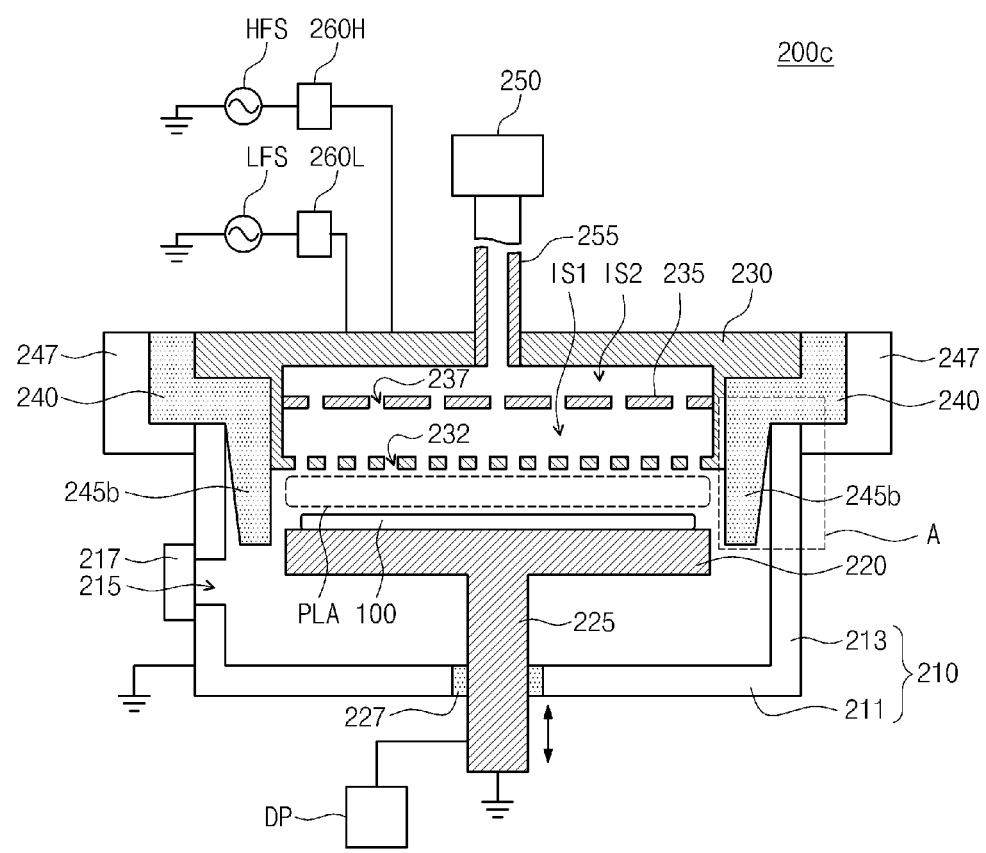
FIG. 7 is a cross-sectional view schematically illustrating a PE-CVD apparatus according to some embodiments of the inventive concepts.
Figure 8:
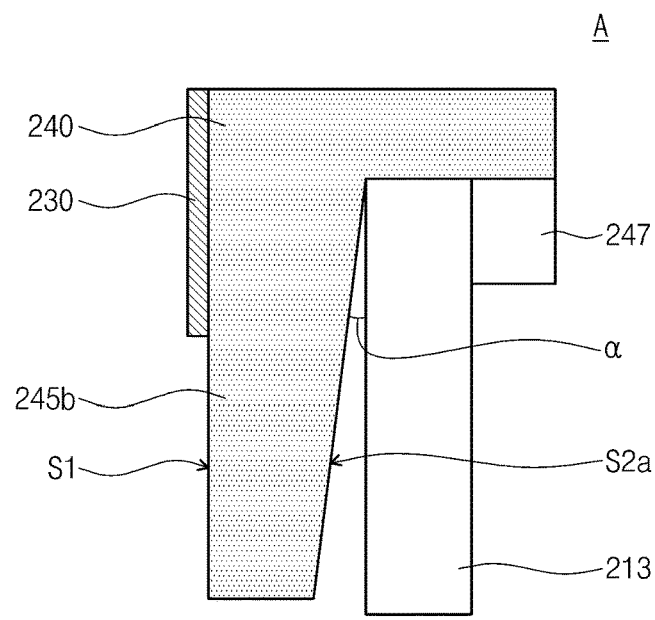
FIG. 8 is an enlarged view of a portion 'A' of FIG. 7.
Figure 9:
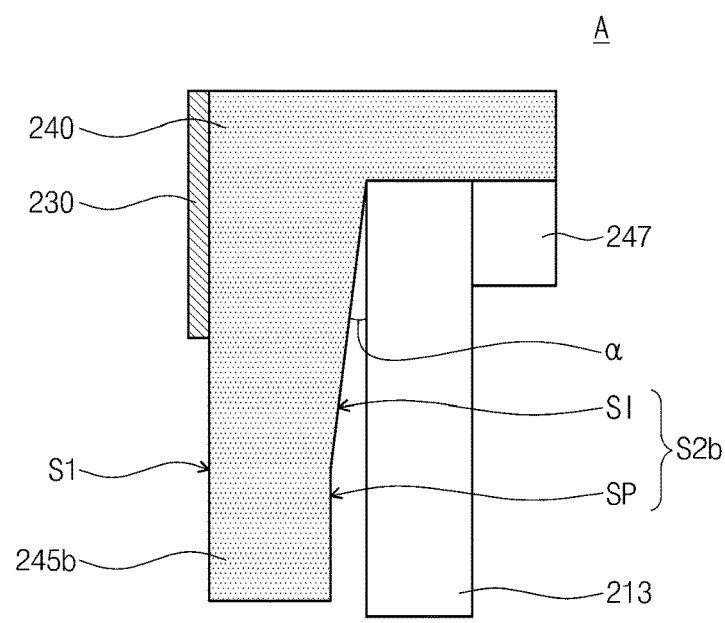
FIG. 9 is an enlarged view of a portion 'A' of FIG. 7 to illustrate a modified embodiment of a PE-CVD apparatus according to some embodiments of the inventive concepts.
Figure 10:
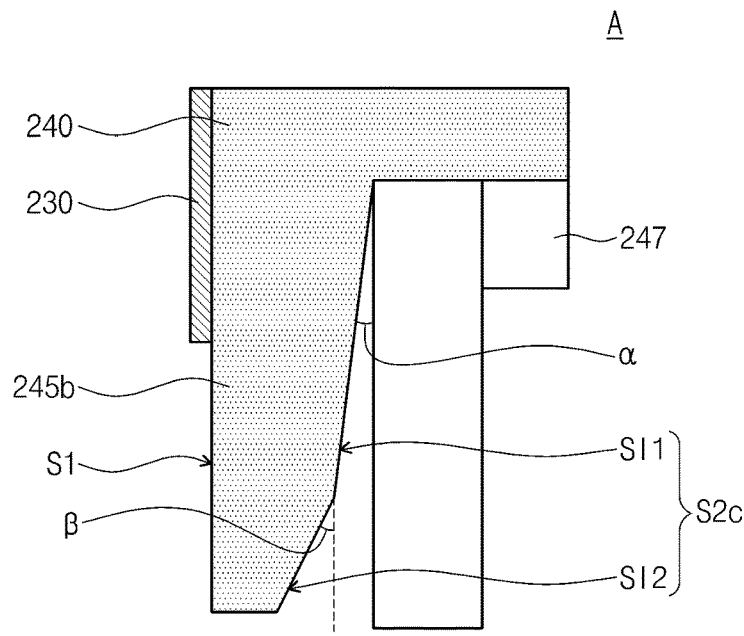
FIG. 10 is an enlarged view of a portion 'A' of FIG. 7 to illustrate another modified embodiment of a PE-CVD apparatus according to some embodiments of the inventive concepts.

FIG. 7 is a cross-sectional view schematically illustrating a PE-CVD apparatus according to some embodiments of the inventive concepts, and FIG. 8 is an enlarged view of a portion 'A' of FIG. 7. FIG. 9 is an enlarged view of a portion 'A' of FIG. 7 to illustrate a modified embodiment of a PE-CVD apparatus according to some embodiments of the inventive concepts. FIG. 10 is an enlarged view of a portion 'A' of FIG. 7 to illustrate a PE-CVD apparatus according to some embodiments of the inventive concepts.

Referring to FIGS. 7 and 8, in a PE-CVD apparatus 200c according some embodiments, an outer sidewall S2a of a fence extension 245b includes at least one inclined surface. The inclined surface may be inclined with respect to a direction perpendicular to the top surface of the chuck 220. As illustrated in FIG. 8, an entire portion of the outer sidewall S2a of the fence extension 245b may correspond to the inclined surface. The inner sidewall of the wall portion 213 of the process chamber 210 may be perpendicular to the top surface of the chuck 220. An angle α between the outer sidewall S2a of the fence extension 245b and the inner sidewall of the wall portion 213 may be greater than 0 degree and equal to or smaller than 45 degrees. For example, the an a may be 10 degrees. The outer sidewall S2a of the fence extension 245b may be spaced apart from the wall portion 213.

In some embodiments, an outer sidewall S2b of the fence extension 245b may include an inclined surface SI and a perpendicular surface SP, as illustrated in FIG. 9. The inclined surface SI may be inclined with respect to the inner sidewall of the wall portion 213 at the angle α, and the perpendicular surface SP may be parallel to the inner sidewall of the wall portion 213. The inclined surface SI and the perpendicular surface SP may be spaced apart from the wall portion 213. The inclined surface SI may be disposed on the perpendicular surface SP.

In some embodiments, an outer sidewall S2c of the fence extension 245b may include a first inclined surface SI1 and a second inclined surface SI2, as illustrated in FIG. 10. The first and second inclined surfaces SI1 and SI2 may be laterally spaced apart from the inner sidewall of the wall portion 213. The first inclined surface SD may be inclined with respect to the inner sidewall of the wall portion 213 (i.e., the direction perpendicular to the top surface of the chuck 220) at a first angle α, and the second inclined surface SI2 may be inclined with respect to the inner sidewall of the wall portion 213 at a second angle β in some embodiments, the second angle β is greater than the first angle α. For example, the first angle α may be greater than 0 degree and smaller than 45 degrees, and the second angle β may be greater than the first angle α and equal to or smaller than 45 degrees.

In some embodiments, the inner sidewall S1 of the fence extension 245b may be perpendicular to the top surface of the chuck 220.

According to some embodiments, the outer sidewall S2a, S2b, or S2c of the fence extension 245b may have the at least one inclined surface. Thus, the fence extension 245b may be easily and stably installed in the process chamber 210, such that the outer sidewall S2a, S2b, or S2c of the fence extension 245b may be easily spaced apart from the wall portion 213 of the process chamber 210.

Other elements and other features of the PE-CVD apparatus 200c according to some embodiments may be the same as corresponding elements and corresponding features of the PE-CVD apparatus 200 according to some embodiments, including example embodiments illustrated in FIGS. 1 and 2.

Next, a method of operating the PE-CVD apparatus according to some embodiments of the inventive concepts will be described. Hereinafter, a method of operating the PE-CVD apparatus 200c of FIGS. 7 and 8 will be described as an example. However, the following operating method may be applied to the other apparatuses 200, 200a, and 200c described above.

Figure 11:
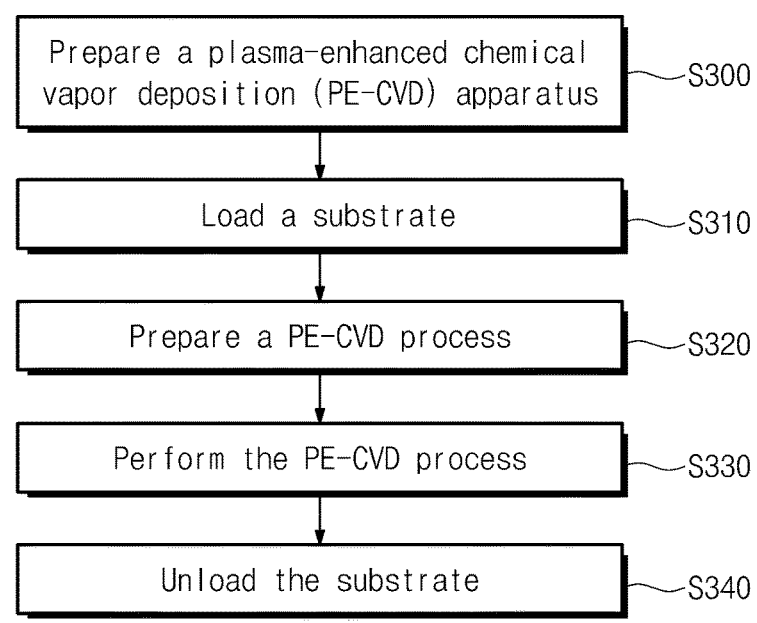
FIG. 11 is a flow chart illustrating a method of operating a PE-CVD apparatus according to some embodiments of the inventive concepts.
Figure 12:
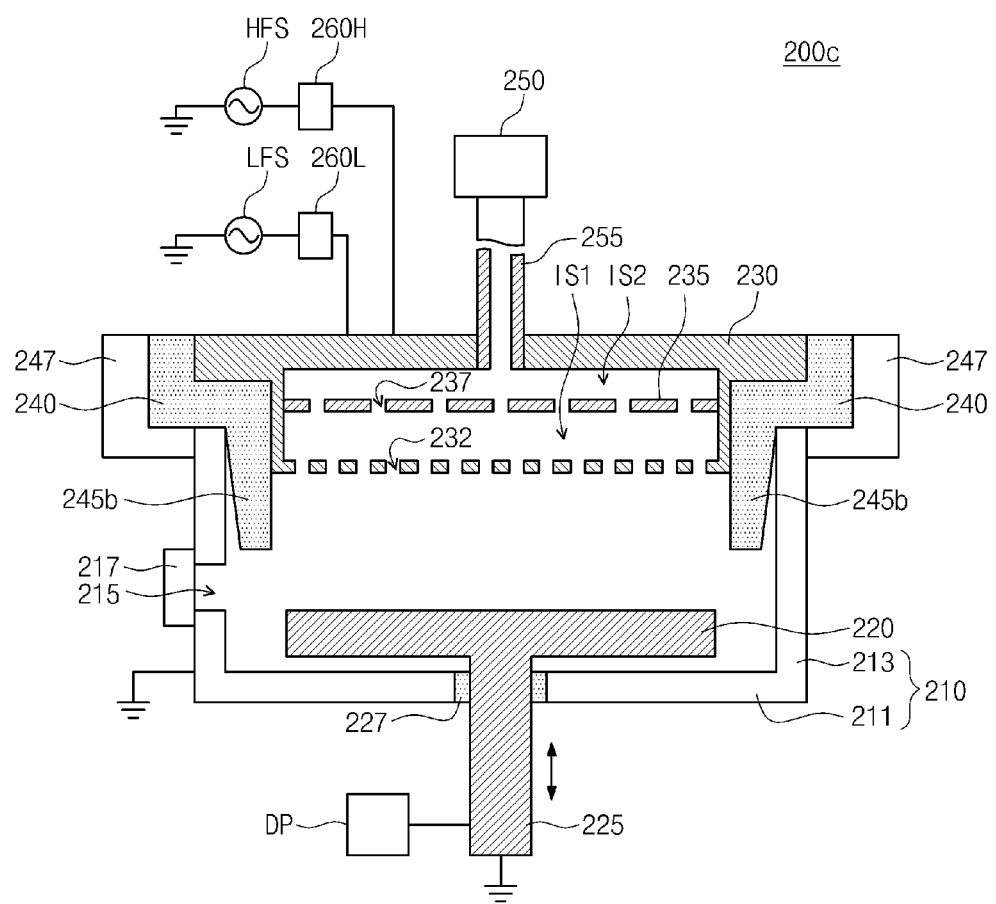
FIG. 12, FIG. 13, and FIG. 14 are cross-sectional views illustrating a method of operating a PE-CVD apparatus according to some embodiments of the inventive concepts.
Figure 13:
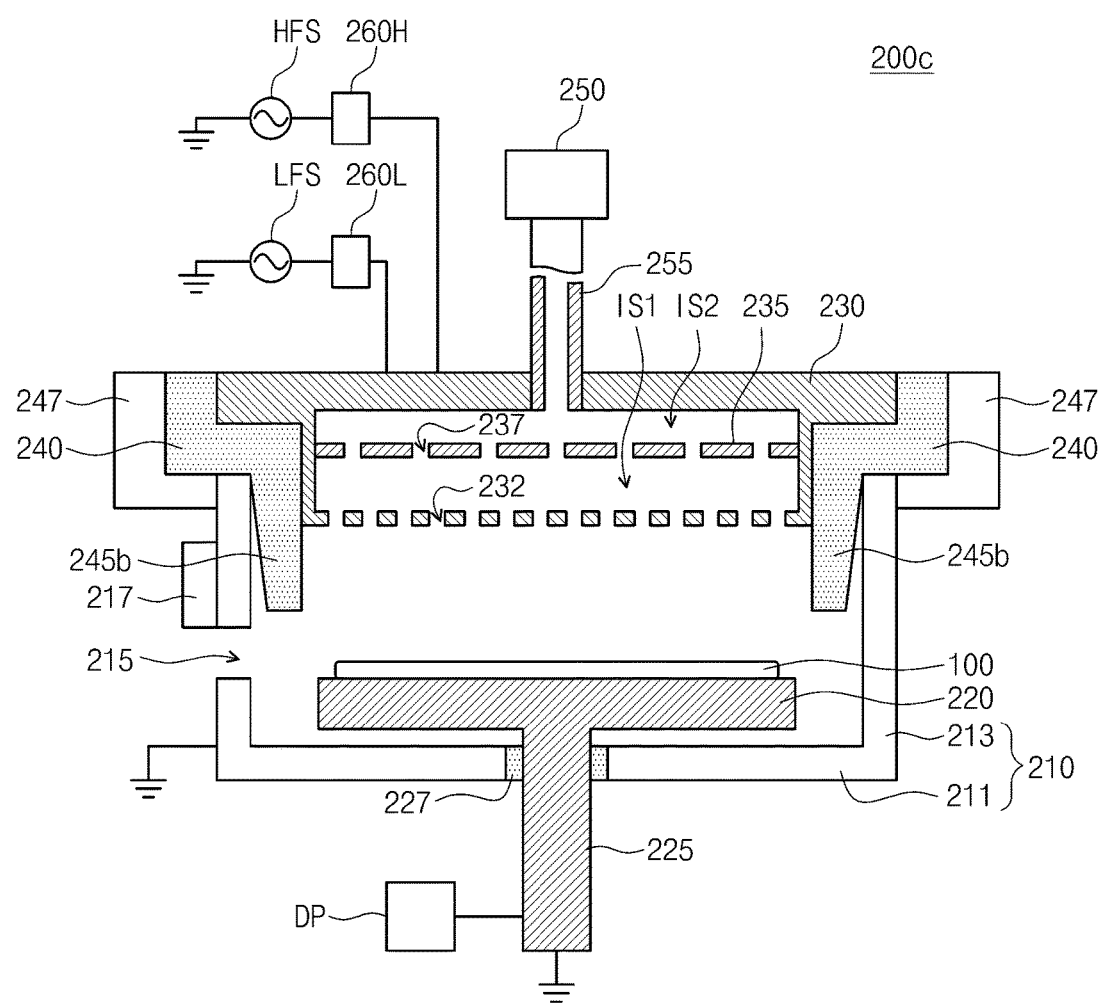
Figure 14:
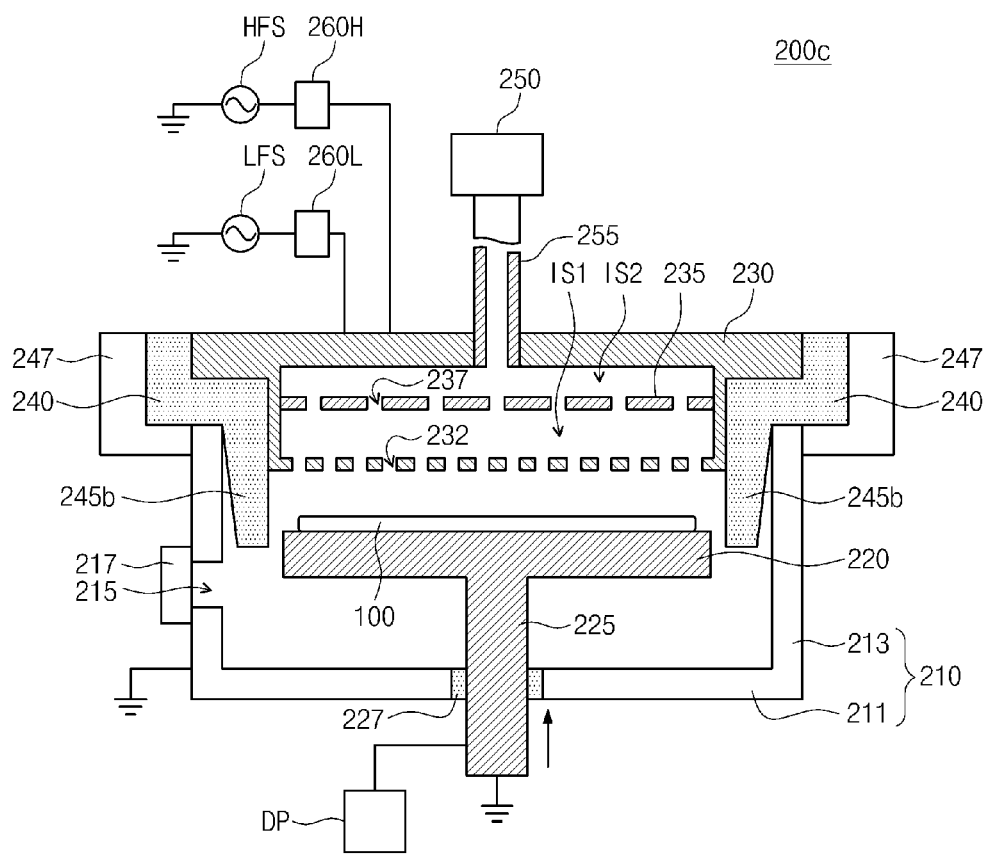

FIG. 11 is a flow chart illustrating a method of operating a PE-CVD apparatus according to some embodiments of the inventive concepts. FIG. 12, FIG. 13, and FIG. 14 are cross-sectional views illustrating a method of operating a PE-CVD apparatus according to some embodiments of the inventive concepts.

Referring to FIGS. 11 and 12, the PE-CVD apparatus 200c may be prepared (S300). The prepared PE-CVD apparatus 200c may be in an idle state. The chuck 220 may descend by the supporter 225 and the driving device DP, so the chuck 220 may be positioned, located, etc. adjacent to the bottom plate 211 of the process chamber 210 when the prepared PE-CVD apparatus 200c is in the idle state. When the prepared PE-CVD apparatus 200c is in the idle state, the top surface of the chuck 220 may be located at a lower level than the top end of the substrate path 215 and the door unit 217 may close the substrate path 215. In addition, the fence extension 245b may not cover the at least a portion of the sidewall of the chuck 220 when the prepared PE-CVD apparatus 200c is in the idle state. Furthermore, when the prepared PE-CVD apparatus 200c is in the idle state, the process gas may not be supplied into the showerhead 230 and the high-frequency power source HFS may not apply the high-frequency power to the showerhead 230.

Referring to FIGS. 11 and 13, the substrate 100 may be loaded on the top surface of the chuck 220 (S310). In detail, the door unit 217 may open the substrate path 215, and the substrate 100 may be transferred into the process chamber 210 through the substrate path 215 by a robot arm (not shown). The substrate 100 transferred into the process chamber 210 may be located on the lift pins (not shown) of the chuck 220. Thereafter, the lift pins may descend to stably load the substrate 100 on the top surface of the chuck 220. The substrate 100 may be fixed on the chuck 220 by the electrostatic force or the vacuum pressure provided from the chuck 220.

Referring to FIGS. 11 and 14, a PE-CVD process may be prepared (S320). In detail, the door unit 217 may close the substrate path 215, and the driving device DP may raise the supporter 225 to reduce a distance between the top surface of the chuck 220 and the bottom surface of the showerhead 230, such that the chuck 220 may approach the position of the showerhead 230 in the PE-CVD apparatus 200c. In response to the distance between the chuck 220 and the showerhead 230 becoming a desired (or, alternatively, predetermined) distance for performing the deposition process, the chuck 220 may be stopped. As described above, the desired (or, alternatively, predetermined) distance may be in the range of 8 mm to 20 mm (in particular, in the range of 10 mm to 18 mm). At this time, the fence extension 245b may surround at least a portion of the sidewall of the loaded substrate 100 or may surround the sidewall of the loaded substrate 100 and at least a portion of the sidewall of the chuck 220. In this case, the fence extension 245b may be spaced apart from the loaded substrate 100 and the chuck 220. In some embodiments, the chuck 220 may heat the loaded substrate 100 to a desired (or, alternatively, predetermined) temperature.

Referring to FIGS. 11 and 7, the PE-CVD process may be performed (S330). In detail, the gas supply unit 250 may supply the process gas into the showerhead 230 through the gas supply pipe 255, and the process gas supplied in the showerhead 230 may be provided into the space which is at least partially bounded vertically between the showerhead 230 and the loaded substrate 100 and which is at least partially bounded horizontally (surrounded) by the fence extension 245b through the second inner space IS2, the second holes 237, the first inner space SP1, and the first holes 232. The high-frequency power generated from the high-frequency power source HFS may be applied to the showerhead 230 through the high-frequency matching box 260H. At this time, the ground voltage may be applied to the chuck 220 and the wall portion 213 and the bottom plate 211 of the process chamber 210. The process gas in the space between the showerhead 230 and the loaded substrate 100 may be converted into the plasma PLA by the high-frequency power, and the PE-CVD process may be performed using the plasma PLA (S330). The plasma PLA may be at least partially confined in the space by the fence extension 245 during the PE-CVD process, such that a desired (or, alternatively, predetermined) layer may be deposited on the loaded substrate 100. In some embodiments, the low-frequency power generated from the low-frequency power source LFS may be applied to the showerhead 230 through the low-frequency matching box 260L during the PE-CVD process.

After the PE-CVD process is completed, the substrate 100 may be unloaded (S340). In detail, the high-frequency power may be interrupted, and residue and/or byproducts of the process gas may be exhausted from the process chamber 210. The chuck 220 may descend by the driving device DP, and the door unit 217 may open the substrate path 215. The substrate 100 may be transferred from the inner space of the process chamber 220 to the outside of the process chamber 220 through the substrate path 215.

Experiments were performed to confirm characteristics of the PE-CVD apparatus according to some embodiments of the inventive concepts. In a first experiment, a first sample and a second sample were prepared. A first silicon nitride layer was formed on the first sample by the deposition apparatus including the fence extension according to some embodiments of the inventive concepts, and a second silicon nitride layer was formed on the second sample by a deposition apparatus not including the fence extension. The height of the fence extension was 20 mm. Other process conditions of the first silicon nitride layer were the same as those of the second silicon nitride layer. For example, the distance between the chuck and the showerhead was 13 mm, and the frequency of the high-frequency power was 27.12 MHz. According to results of the first experiment, a thickness uniformity of the first silicon nitride layer was 1.37%, and a thickness uniformity of the second silicon nitride layer was 8.5%. As a result, it is confirmed that the thickness uniformity of the deposition layer is improved by the deposition apparatus according to some embodiments of the inventive concepts. Thicknesses of the layer were measured at 49 spots uniformly distributed on each of the first and second samples, and the thickness uniformity of each of the first and second samples was calculated using the measured thicknesses. The thickness uniformity was calculated by an equation UNF (%)=((MAX−MIN)/AVG)×50. In the equation, "UNF" denotes the thickness uniformity, "MAX" denotes the maximum value of the measured thicknesses, "MIN" denotes the minimum value of the measured thicknesses, and "AVG" denotes an average value of the measured thicknesses. In addition, a deposition rate of the first silicon nitride layer was 2011 angstroms/min, and a deposition rate of the second silicon nitride layer was 1963 angstroms/min. Thus, it is confirmed that the deposition rate of the deposition layer is improved by the deposition apparatus according to some embodiments of the inventive concepts.

In a second experiment, a third sample and a fourth sample were prepared. A first TEOS layer was formed on the third sample by the deposition apparatus including the fence extension according to some embodiments of the inventive concepts, and a second TEOS layer was formed on the fourth sample by a deposition apparatus not including the fence extension. Other process conditions of the first TEOS layer except the fence extension were the same as those of the second TEOS layer. According to results of the second experiment, a thickness uniformity of the first TEOS layer was 1.47%, and a thickness uniformity of the second TEOS layer was 7.9%. Thus, it is confirmed that the thickness uniformity of the deposition layer is improved by the deposition apparatus according to some embodiments of the inventive concepts. In addition, a deposition rate of the first TEOS layer was 1987 angstroms/min, and a deposition rate of the second TEOS layer was 1847 angstroms/min. Thus, it is confirmed that the deposition rate of the deposition layer is improved by the deposition apparatus according to some embodiments of the inventive concepts.

As described above, the fence extension may extend downward from the insulating body. The fence extension may be disposed between the plasma and the wall portion of the process chamber during the deposition process, such that the fence extension at least partially surrounds the plasma and at least a portion of the sidewall of the loaded substrate during the deposition process. Thus, the fence extension may at least partially confine the plasma during the deposition process, so it is possible to reduce or minimize the difference between the density of the plasma over the edge portion of the loaded substrate and the density of the plasma over the central portion of the loaded substrate, such that the thickness uniformity and reliability of the deposition layer may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A plasma-enhanced chemical vapor deposition (PE-CVD) apparatus comprising:
    a process chamber including a wall portion and a bottom plate that define an inner space in which a deposition process is performed;
    a chuck in the process chamber, the chuck movable in a vertical direction, and the chuck including a top surface configured to support a substrate loaded during the deposition process;
    a showerhead disposed over the chuck, the showerhead including an upper surface having a first width within the wall portion and a lower surface having a second width smaller than the first width within the wall portion;
    an insulating body surrounding a sidewall of the showerhead, the insulating body including,
    a fence extension extending downward from the insulating body, the fence extension disposed in the process chamber, the insulating body and the fence extension constituting one body; and
    a high-frequency power source, coupled to the showerhead, configured to generate plasma between the showerhead and the loaded substrate supported on the top surface of the chuck during the deposition process,
    wherein the fence extension is at least partially disposed between the wall portion and the plasma during the deposition process, and wherein the fence extension has an inner width that is the same as the second width, the fence extension extending linearly from the lower surface of the showerhead to below an upper surface of the chuck so as to form the plasma having a third width smaller than the second width, between the chuck and the showerhead, so as to decrease a difference of densities of the plasma on a center and an edge of the substrate.

2. The PE-CVD apparatus of claim 1, wherein a height of the fence extension from a bottom surface of the showerhead to a bottom surface of the fence extension is greater than a distance between the bottom surface of the showerhead and a top surface of the loaded substrate during the deposition process.

3. The PE-CVD apparatus of claim 2, wherein the height of the fence extension is greater than a distance between the bottom surface of the showerhead and the top surface of the chuck during the deposition process.

4. The PE-CVD apparatus of claim 3, wherein the fence extension surrounds the plasma, a sidewall of the loaded substrate, and at least a portion of a sidewall of the chuck during the deposition process.

5. The PE-CVD apparatus of claim 1, wherein the fence extension is spaced apart from the wall portion, and
    wherein the fence extension is spaced apart from the chuck and the loaded substrate during the deposition process.

6. The PE-CVD apparatus of claim 1, wherein the insulating body and the fence extension include the same insulating material.

7. The PE-CVD apparatus of claim 1, wherein,
the high-frequency power source is configured to generate the plasma based on generating high-frequency power comprising a frequency higher than 13.56 MHz and equal to or lower than 2.4 GHz.

8. The PE-CVD apparatus of claim 7, further comprising:
a low-frequency power source coupled to the showerhead and configured to generate low-frequency power, the low-frequency power including a frequency lower than the frequency of the high-frequency power.

9. The PE-CVD apparatus of claim 1, wherein,
the fence extension includes, an inner sidewall configured to be located adjacent to the plasma during the deposition process; and an outer sidewall opposite to the inner sidewall, and
an inner width of the fence extension between opposite-facing portions of the inner sidewall is greater than a width of the top surface of the chuck.

10. The PE-CVD apparatus of claim 1, wherein a width of a bottom surface of the showerhead is greater than a width of the top surface of the chuck.

11. The PE-CVD apparatus of claim 1, wherein the fence extension includes,
an inner sidewall configured to be located adjacent to the plasma during the deposition process; and
an outer sidewall opposite to the inner sidewall;
wherein the outer sidewall of the fence extension including at least one inclined surface; and
wherein the at least one inclined surface is inclined with respect to a direction perpendicular to the top surface of the chuck.

12. The PE-CVD apparatus of claim 1, wherein the insulating body and the fence extension each include closed-loop shapes.

* * * * *